US008922271B1

(12) United States Patent
Moothedath et al.

(10) Patent No.: US 8,922,271 B1
(45) Date of Patent: Dec. 30, 2014

(54) PROGRAMMABLE HIGH CURRENT VOLTAGE SUPPLY FOR AUTOMATIC TEST EQUIPMENT (71) Applicant: Micrel, Inc., San Jose, CA (US)

(72) Inventors: Rajesh Moothedath, San Jose, CA (US); Douglas Falco, Saratoga, CA (US)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 13/953,669

(22) Filed: Jul. 29, 2013

(51) Int. Cl.
*G05F 1/10* (2006.01)
*G01R 35/00* (2006.01)
*G05F 1/614* (2006.01)
*G05F 1/46* (2006.01)

(52) U.S. Cl.
CPC .............. *G01R 35/007* (2013.01); *G05F 1/614* (2013.01); *G05F 1/462* (2013.01)
USPC ........................................................ 327/540

(58) Field of Classification Search
USPC .................................. 327/538, 540, 541, 543
See application file for complete search history.

(56) References Cited

U.S. PATENT DOCUMENTS

| 5,057,772 | A | * | 10/1991 | Bruno et al. | ............. | 324/754.03 |
| 5,694,063 | A | * | 12/1997 | Burlison et al. | ................. | 327/50 |
| 5,917,331 | A | * | 6/1999 | Persons | .................... | 324/762.02 |
| 8,228,108 | B2 | * | 7/2012 | Torres et al. | ................... | 327/307 |

* cited by examiner

*Primary Examiner* — Jeffrey Zweizig
(74) *Attorney, Agent, or Firm* — Van Pelt, Yi & James LLP (57) ABSTRACT

A voltage-current conversion circuit for automatic test equipment (ATE) or a tester converts a low voltage, low current output from a power supply of the tester to a high voltage and/or high current output to be coupled to a device under test (DUT) while maintaining the sense capability of the tester power supply. In some embodiments, the voltage-current conversion circuit is implemented as a current only conversion circuit.

19 Claims, 6 Drawing Sheets

PROGRAMMABLE HIGH CURRENT VOLTAGE SUPPLY FOR AUTOMATIC TEST EQUIPMENT

BACKGROUND OF THE INVENTION

Figure 1:
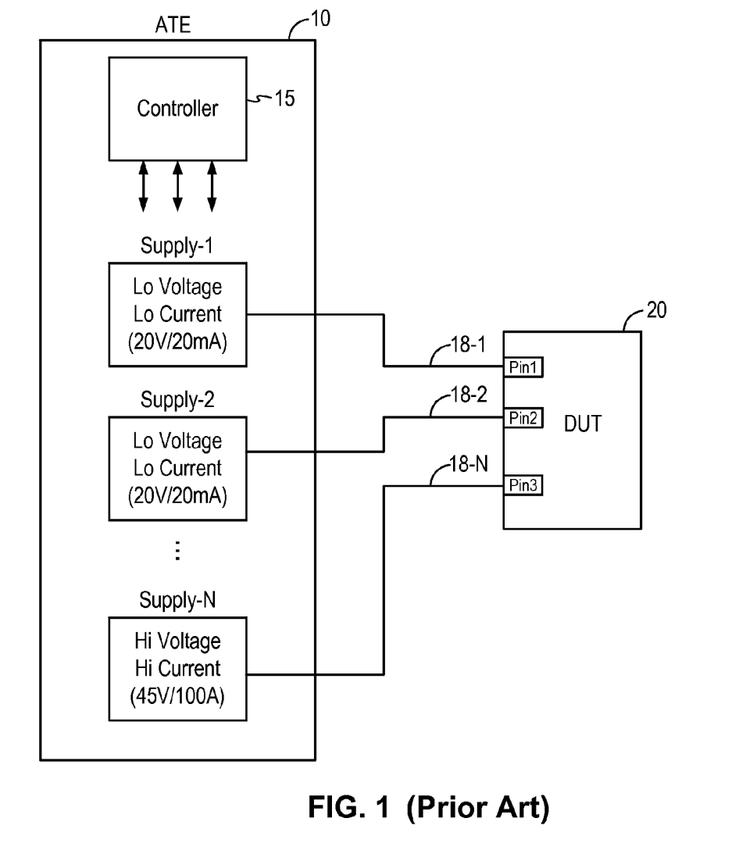
FIG. 1 is a schematic diagram of a conventional semiconductor ATE.

Semiconductor automatic test equipment (ATE) is used in semiconductor manufacturing processes to perform electrical testing and/or characterization of semiconductor devices. The semiconductor device being tested is usually referred to as the Device Under Test (DUT). FIG. 1 is a schematic diagram of a conventional semiconductor ATE. Referring to FIG. 1, an ATE 10, or a "tester," generally includes multiple programmable power supplies, such as Supply-1 to Supply-N, under the control of a controller 15. The controller 15 directs one or more power supplies to apply certain stimuli to the device under test (DUT) 20 and also to measure or detect responses from the DUT 20. In particular, each power supply is configured to provide a driving voltage and a driving current within a given specified range, such as up to 20V and 20 mA. Each power supply has an output terminal 18 coupled to a pin of the DUT 20. The pin can be an input pin, an output pin, or an input-output pin.

Some semiconductor devices require high current or high voltage in certain modes of operation. One limitation of low cost ATE is the lack of sufficient programmable high power (>20 mA) voltage sources which limits the tester's ability to test semiconductor devices that operate at high voltage and/or high current level. Commercially available ATEs that include one or more high voltage or high current power supplies are typically very costly. Furthermore, these expensive ATEs typically include only a limited number of high voltage/high current power supplies, which is often not sufficient for testing some semiconductor devices or for testing multiple devices simultaneously. Some attempts to provide a high current/voltage power supply in a tester include using an amplifier to amplify the voltage and current at the output terminal of the low voltage power supply. However, insertion of such amplifier into the connection between the power supply and the DUT breaks the sense connection of the tester and prevents the tester from sensing or detecting the signal level at the DUT pin.

Figure 2:
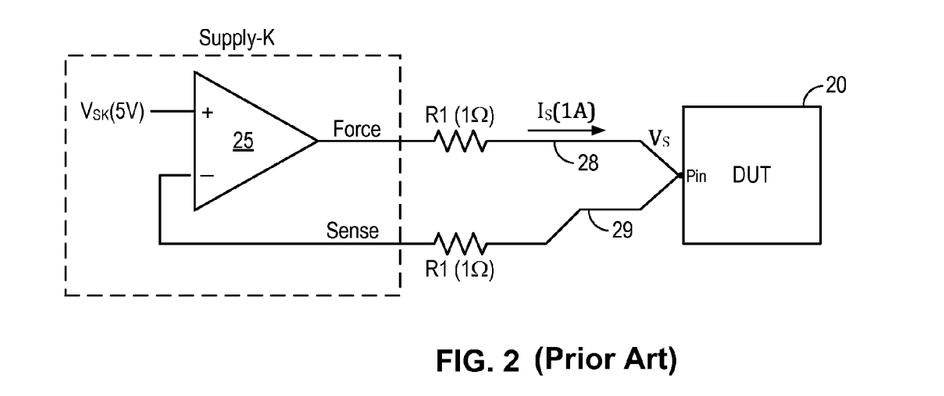
FIG. 2 is a schematic diagram of the force/sense connection between a power supply on a tester and a pin of the DUT.

FIG. 2 is a schematic diagram of the force/sense connection between a power supply on a tester and a pin of the DUT. Referring to FIG. 2, the output terminal of a power supply Supply-K in a tester includes a force line (node 28) and a sense line (node 29) that are Kelvin connected to a pin in the DUT 20. The force line and sense line are sometimes referred to as a force-and-sense pair. The force and sense lines are connected together at the DUT pin to form a Kelvin connection. In a Kelvin connection, the power supply Supply-K supplies current via the force line (node 28) and the voltage at the DUT pin is sensed by the sense line (node 29) while no current flows in the sense line. The power supply Supply-K forces a programmed voltage $V_{SK}$ (e.g., 5V) onto the force line at a given current level and senses the voltage at the DUT pin from the sense line to determine if the desired voltage is provided at the DUT. Here, assuming the force line (node 28) has a 1 ohm resistance and the power supply current $I_S$ is 1 A. The voltage $V_S$ at the DUT pin is actually only 4V due to the voltage drop on the force line. The sensed voltage $V_S$ is fed back to the power supply Supply-K and the power supply, such as through amplifier 25, drives the force line until the sensed voltage $V_S$ at the DUT is the same as the programmed voltage $V_{SK}$. To ensure driving and sensing operation at the tester, the force-and-sense pair connection between the tester and the DUT should not be broken or the tester will not be able to measure the voltage at the DUT correctly.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications, and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

According to embodiments of the present invention, a voltage-current conversion circuit for an automatic test equipment (ATE) or a tester converts a low voltage, low current output from a power supply of the tester to a high voltage and/or high current output to be coupled to a device under test (DUT) while maintaining the remote sense or measurement capability of the tester power supply. The voltage-current conversion circuit is capable of retaining the force and sense accuracy as the tester power supply. When incorporated in a tester, the voltage-current conversion circuit is transparent to the power supply of the tester and the DUT and the tester operates as if it is directly driving and sensing the DUT. In this manner, an ATE with only low voltage, low current power supplies can be equipped with the voltage-current conversion circuit of the present to provide the high current or high voltage needed to test semiconductor devices that require high current or high voltage in certain modes of operation. In some embodiments, the voltage-current conversion circuit is implemented as a current only conversion circuit.

Figure 3:
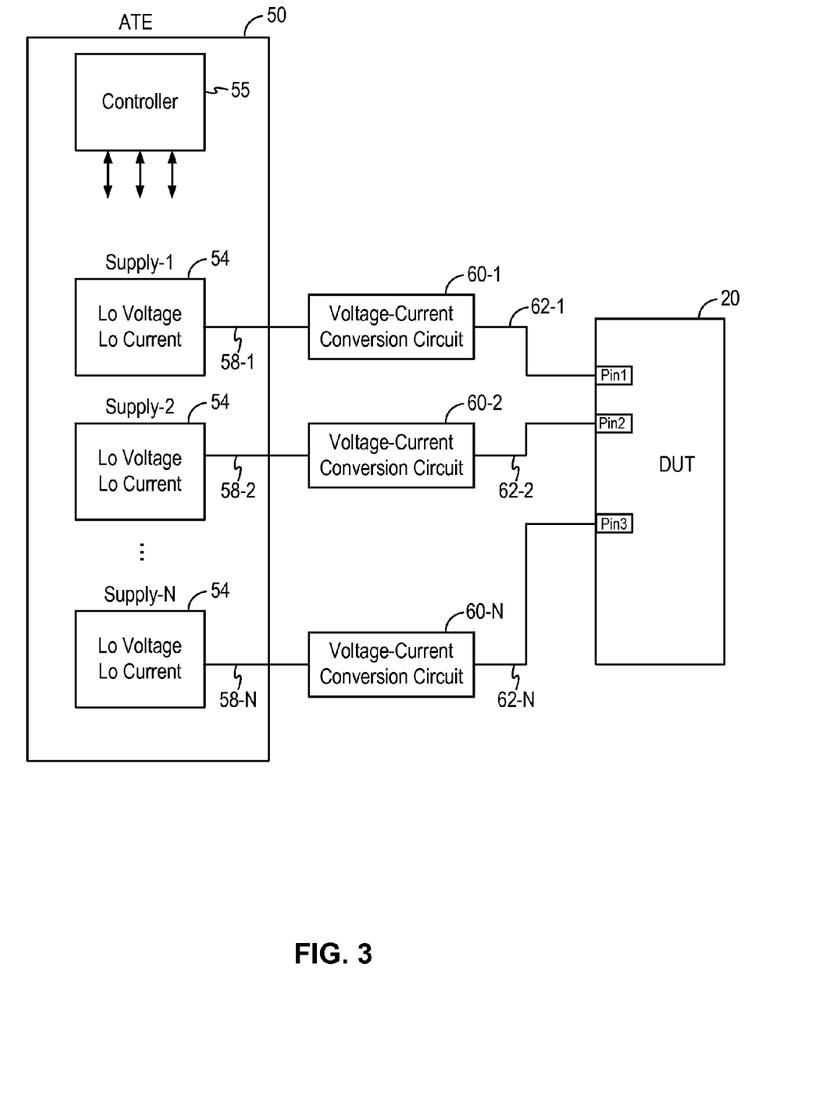
FIG. 3 is a block diagram of an ATE incorporating the voltage-current conversion circuit in embodiments of the present invention.

FIG. 3 is a block diagram of an ATE incorporating the voltage-current conversion circuit in embodiments of the present invention. Referring to FIG. 3, an ATE 50, or a "tester," includes multiple programmable power supplies 54, such as Supply-1 to Supply-N, under the control of a controller 55. The controller 55 directs one or more power supplies 54 to apply certain stimuli to the device under test (DUT) 20 and also to measure or detect responses from the DUT 20. In the present embodiments, the programmable power supplies ("tester power supplies") 54 are high accuracy, low voltage, low current programmable power supplies. For instance, each of power supply Supply-1 to Supply-N is configured to provide a driving voltage and a driving current within a given specified range, such as up to 20V and 20 mA. Each power supply 54 has an output terminal 58 coupled to a pin of the DUT 20. The pin can be an input pin, an output pin, or an input-output pin.

In embodiments of the present invention, a voltage-current conversion circuit 60 is coupled to each tester power supply 54 to enable the low voltage/low current power supply 54 of the tester to provide high voltage and/or high current stimuli to the DUT. In the present embodiment, each power supply 54 (Supply-1 to Supply-N) of the tester 50 is coupled to a voltage-current conversion circuit (60-1 to 60-N), respectively. In other embodiments, the voltage-current conversion circuit 60 may be coupled to a subset of the tester's programmable power supplies 54.

Each of the voltage-current conversion circuits 60-1 to 60-N receives a driving voltage and a driving current from the associated tester power supply (e.g. Supply-K). The voltage-current conversion circuit 60 translates the received voltage/current to provide a boosted voltage and/or a boosted current to a pin of the DUT 20. More importantly, the voltage-current conversion circuit 60 preserves the sense or measurement capability of the associated tester power supply so that the tester power supply operates as if it is driving and sensing the DUT 20 directly. In particular, the voltage-current conversion circuit 60 provides a translated or scaled-down load signal to the output terminal 58 of the tester power supply so that the tester power supply operates in a normal manner to regulate its driving voltage and driving current within its own voltage/current limit. Meanwhile, the voltage-current conversion circuit 60 boosts or amplifies the driving voltage and driving current from the tester power supply to provide a high voltage and/or high current output stimulus to the DUT pin. In some embodiments of the present invention, by using the voltage-current conversion circuit of the present invention, the ATE 50 is capable of providing high current programmable voltages to a DUT using low cost, high accuracy, low current programmable power supplies.

In one embodiment, a tester power supply 54, operating under the control of the controller 55, provides voltage/current stimuli to a pin of the DUT 20. The tester power supply 54 operates as if it is supplying the driving voltage and driving current to the DUT and it is sensing the voltage at the DUT. The voltage-current conversion circuit 60 receives the driving voltage and driving current from the tester power supply 54 and boosts the voltage and current supplied by the tester power supply. The voltage-current conversion circuit 60 provides the boosted power stimuli or the high voltage-high current stimuli to the DUT pin. The voltage-current conversion circuit 60 also senses the voltage at the DUT pin and regulates the boosted voltage based on the sensed voltage. Meanwhile, the voltage-current conversion circuit 60 provides a translated load signal to the tester power supply output terminal 58 so that the tester power supply 54 senses a feedback voltage proportional to the actual voltage at the DUT pin. The tester power supply 54 can then continue to control the accuracy of the driving voltage and driving current as if it is directly driving the DUT. In one embodiment, the voltage-current conversion circuit implements ratiometric sensing so that the tester power supply senses a scaled-down voltage of the actual voltage supplied to the DUT pin by the voltage-current conversion circuit 60.

In embodiments of the present invention, the voltage-current conversion circuit 60 is configured to provide high power output signal in any combination of voltage and current. That is, the voltage-current conversion circuit 60 can provide an output with high current and low voltage, or an output with low current and high voltage, or an output with high current and high voltage.

Furthermore, in embodiments of the present invention, the voltage-current conversion circuit 60 maintains the four quadrant supply capability of the tester power supply. A tester power supply is a four-quadrant power supply capable of handling positive and negative loads at the output terminal. That is, the tester power supply is capable of sourcing or sinking current. The voltage-current conversion circuit 60 is Kelvin connected to the DUT pin and provides a translated load signal back to the tester power supply so that the tester power supply continues to operate as a four-quadrant power supply.

The voltage-current conversion circuit or current only conversion circuit of the present invention provides many advantages. First, the conversion circuit of the present invention enables low cost or legacy ATE with only low voltage/current power supplies to be retrofitted to provide high voltage/high current outputs. Thus, inexpensive low current and low voltage ATE resources can be used to test or characterize high current semiconductor devices including complex, multiple input and output high power devices. The lifespan of legacy ATE can thus be extended. Alternately, significant cost saving can be achieved by configuring low cost, low current ATE for high voltage/high current applications as opposed to procuring expensive ATE with high voltage/current capabilities.

Second, the conversion circuit of the present invention provides feedback sensing to the tester power supply so that the accuracy of the tester power supply is maintained by the conversion circuit. The conversion circuit is thus capable of providing high power stimuli to the DUT with high accuracy.

Third, the conversion circuit of the present invention is a small modular circuit and thus the conversion circuit can be incorporated in some or all of the power supplies in a tester to configure the power supplies to provide high voltage and high current. Thus, a tester can be configured to have as many high voltage/high current power supplies as needed for testing high power semiconductor devices. The number of high voltage/high current power supplies in a tester is no longer limited.

Lastly, power supplies in an ATE are typically provided with a given current limit. In embodiments of the present invention, the voltage-current conversion circuit leverages the current limit of the tester power supplies to limit the boosted current provided to the DUT. In this manner, the voltage-current conversion circuit does not need to implement separate current limiting function.

Figure 4:
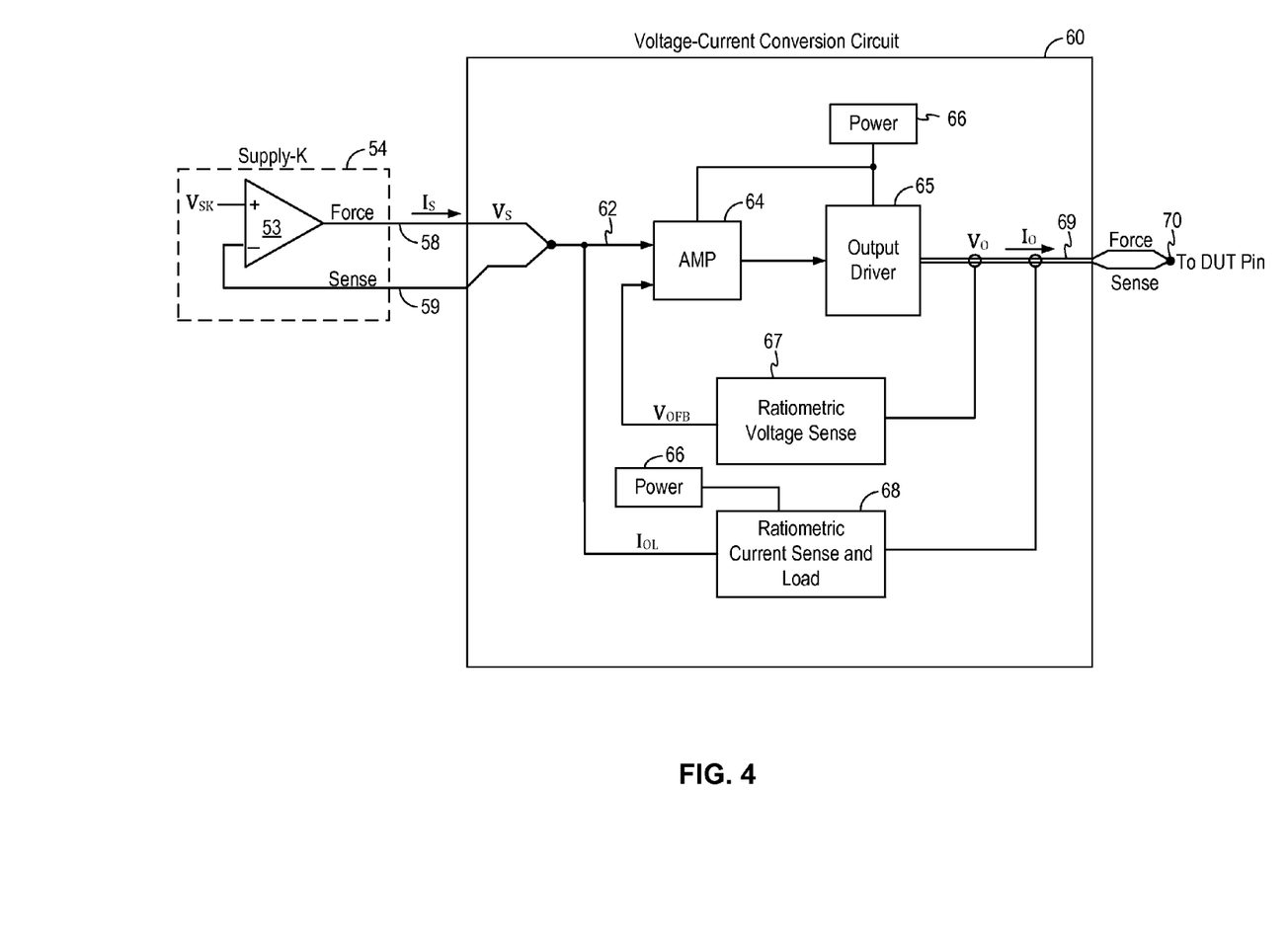
FIG. 4 is a schematic diagram of a voltage-current conversion circuit according to one embodiment of the present invention.

FIG. 4 is a schematic diagram of a voltage-current conversion circuit according to one embodiment of the present invention. Referring to FIG. 4, the voltage-current conversion circuit 60 of the present invention is coupled to work with a Kelvin connected, low current, programmable ATE power supply, such as the tester power supply 54 of ATE 50 in FIG.

3. The tester power supply 54 drives the voltage-current conversion circuit that contains power circuitry to boost the driving voltage and driving current received from the tester power supply. The voltage-current conversion circuit 60 delivers the high voltage/high current stimuli to the DUT using a Kelvin connected output terminal. The voltage-current conversion circuit 60 senses voltage and current measurements at the DUT pin and feedback a scaled version of the sensed voltage and sensed current for regulation and control. In this manner, the tester power supply 54 retains the voltage and current measurement capability as if the tester power supply is driving the DUT pin directly.

As shown in FIG. 4, the output terminal of the Kelvin connected tester power supply 54 (Supply-K) includes a force line (node 58) and a sense line (node 59) that are Kelvin connected together to an output node 62. The force line 58 and sense line 59 are sometimes referred to as a force-and-sense pair. The Kelvin connected output node 62 is normally coupled to a DUT pin for applying stimuli to the pin. In a Kelvin connection, the tester power supply 54 supplies a driving current $I_S$ via the force line (node 58) to force a driving voltage $V_S$ at the output node 62. The voltage at the output node 62 is sensed by the sense line (node 59) while no current flows in the sense line. In operation, the tester power supply 54 forces a programmed voltage $V_{SK}$ (e.g., 5V) onto the force line 58 at a given current level $I_S$, such as through the use of a driver or amplifier 53. The sense line 59 couples the voltage $V_S$ sensed from the output node 62 back to the driver 53. The driver 53 is configured in a negative feedback configuration to force the voltage $V_S$ to equal to the programmed voltage $V_{SK}$. In other words, the tester power supply 54 adjusts the gain of the driver 53 to drive the output node 62 until the driving voltage $V_S$ is equal to the programmed voltage $V_{SK}$, within a given current level $I_S$. The tester power supply 54 operates with a given accuracy level so that the current $I_S$ and the voltage $V_S$ at the output node 62 are generated within the given accuracy limit. In some cases, the tester power supply 54 also operates with a given current limit to limit the driving current $I_S$ to a given level.

The voltage-current conversion circuit 60 of the present invention is coupled between the tester power supply 54 and the DUT pin. More specifically, the voltage-current conversion circuit 60 has an input terminal coupled to the Kelvin connected output node 62 of the tester power supply 54 and has an output terminal 69 being a Kelvin connected force-and-sense pair connected to the DUT pin (node 70). The voltage-current conversion circuit 60 allows the high accuracy, low current tester power supply 54 to be used to control the accuracy and program the voltage to be applied to the DUT pin but with the energy coming from a high voltage/current power source. The voltage-current conversion circuit 60 provides a high voltage and/or high current programmable output signal where the accuracy of the output signal supplied to the DUT is dictated by the accuracy of the tester power supply 54.

In voltage-current conversion circuit 60, the tester output node 62 is coupled to a first input terminal of an amplifier 64. The amplifier 64 generates an amplifier output signal on an output terminal which is coupled to an output driver circuit 65. The output driver circuit 65 generates a driver output signal on the output terminal 69 being a Kelvin connected force-and-sense pair. The driver output signal is coupled through the force-and-sense pair (terminal 69) to the DUT pin (node 70). Both the amplifier 64 and the output driver 65 are supplied by a power source 66. In some embodiments, the power source 66 provides a high voltage and/or a high current output. Accordingly, the amplifier 64 and the output driver 65 generate a driver output signal having boosted voltage and/or boosted current values.

In some embodiments, the power source 66 is a fixed voltage, high current power supply available in the ATE 10. In other embodiments, the power source 66 is a power supply external to the ATE. The power source 66 can be configured to provide a power output being a high voltage output, or a high current output, or both high voltage and high current output. In embodiments of the present invention, the voltage-current conversion circuit 60 can be configured to generate the driver output signal being a high voltage output signal, or a high current output signal, or both high voltage and high current output signal. In the present embodiment, the voltage-current conversion circuit 60 is configured to provide high current output signal at a nominal voltage level in both current sinking and current sourcing conditions. The present embodiment is illustrative only and not intended to be limiting.

The voltage-current conversion circuit 60 includes a feedback circuit to sense the output voltage $V_O$ and the output current $I_O$ at the output terminal 69 and feedback the sensed signals for feedback regulation. In particular, the amplifier 64 is the voltage setting amplifier for the voltage-current conversion circuit 60 and regulates the output voltage $V_O$ at the output node 70 in response to a feedback voltage signal $V_{OFB}$. In embodiments of the present invention, the feedback circuit includes a ratiometric voltage sense circuit 67 to sense the output voltage $V_O$ on the output terminal 69 and to generate the feedback voltage signal $V_{OFB}$ being a scaled down version of the output voltage $V_O$. The feedback voltage signal $V_{OFB}$ is coupled to a second input terminal of the amplifier 64 to be compared with the driving voltage $V_S$. The amplifier 64 adjusts its output voltage to cause the feedback voltage signal $V_{OFB}$ to equal to the driving voltage $V_S$. In this manner, the voltage $V_O$ at the DUT pin is regulated by the voltage-current conversion circuit 60 but the accuracy of the voltage is maintained by the tester power supply 54 which controls the driving voltage $V_S$.

In embodiments of the present invention, the feedback circuit includes a ratiometric current sense and load circuit 68 to sense the output current $I_O$ on the output terminal 69 and to generate a current load signal $I_{OL}$ being a scaled down version of the output current $I_O$. In particular, the ratiometric current sense and load circuit 68 presents a simulated load to the tester output node 62 that is proportional to the load presented at the DUT pin (node 70). In one embodiment, the ratiometric current sense and load circuit 68 presents a load to the tester output node 62 that is a scaled down version of the load at DUT pin (node 70). The ratiometric current sense and load circuit 68 is powered by the power source 66. In operation, the ratiometric current sense and load circuit 68 senses the output current $I_O$ on the output terminal 69. The circuit 68 divides the sensed output current $I_O$ by a given ratio, such as through a ratiometric current divider, to generate the current load signal $I_{OL}$. The ratiometric current sense and load circuit 68 loads the tester output load 62, in particular the force line 58 of the tester power supply, with the scaled down current $I_{OL}$ so that the force line 58 of the tester power supply sees a load that is a ratio of the actual load at the DUT pin.

In this manner, the feedback circuit in the voltage-current conversion circuit allows the tester power supply to control the accuracy of the voltage and current supplied to the DUT pin while allowing the voltage-current conversion circuit to supply the DUT pin with a high voltage or high current signal. In one embodiment, the current limit function of the tester power supply is retained and is scaled accordingly by the voltage-current conversion circuit when driving the DUT pin.

Figure 5:
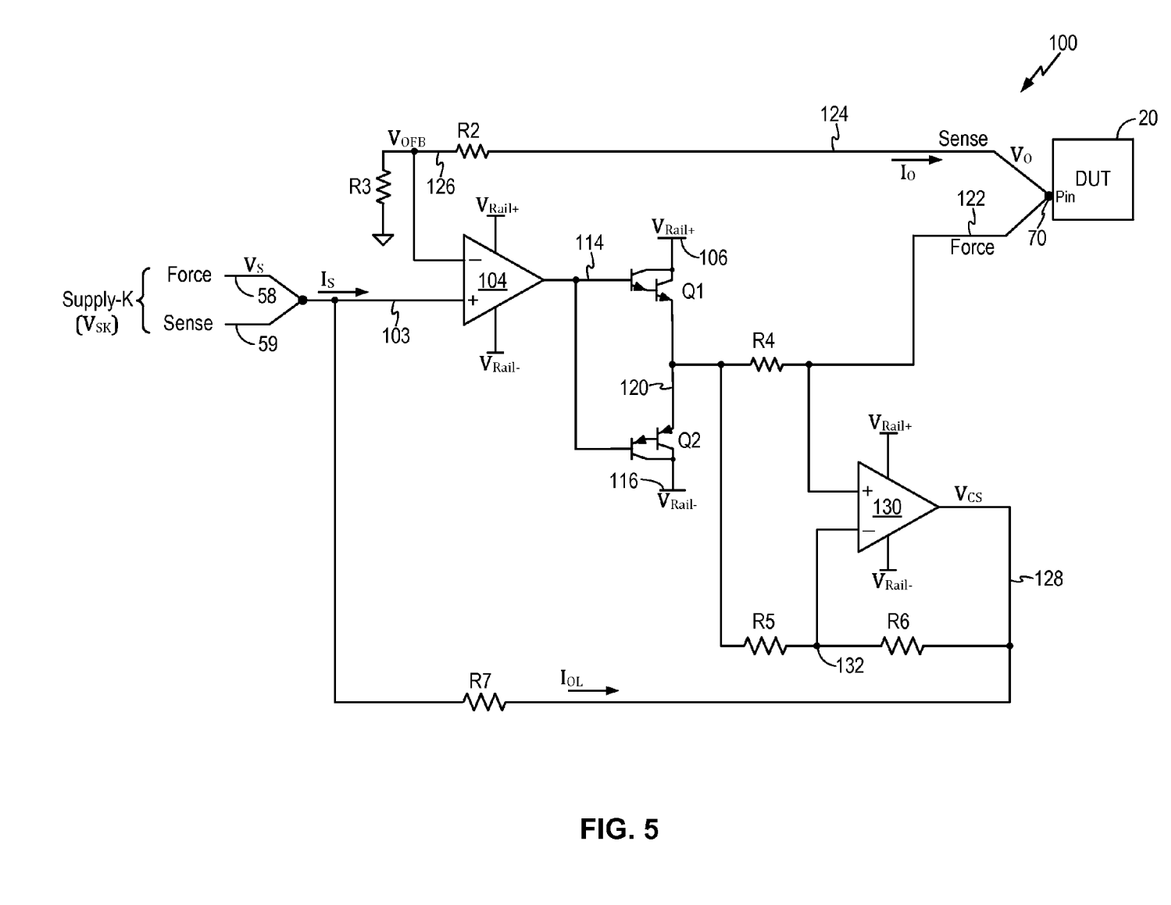
FIG. 5 is a circuit diagram of a voltage-current conversion circuit according to one embodiment of the present invention.

FIG. 5 is a circuit diagram of a voltage-current conversion circuit according to one embodiment of the present invention. Referring to FIG. 5, a voltage-current conversion circuit 100 ("circuit 100") receives a supply power from a power source, represented by the positive rail voltage $V_{Rail+}$ (node 106) and the negative rail voltage $V_{Rail-}$ (node 116). The supply power $V_{Rail+}$ and $V_{Rail-}$ can be a high voltage and/or high current power supply. The supply power is coupled to power a first operational amplifier 104, a pair of Darlington transistors Q1 and Q2, and a second operational amplifier 130.

The first operational amplifier 104 is the input amplifier of circuit 100 and has a positive (non-inverting) input terminal 103 coupled to the tester output node to receive the driving voltage $V_S$ and the driving current $I_S$. The first operational amplifier 104 includes a negative (or inverting) input terminal coupled to receive the feedback voltage signal $V_{OFB}$. The amplifier 104 has an output terminal 114 coupled to drive the gate terminals of the pair of serially connected Darlington transistors Q1 and Q2. The transistors pair Q1 and Q2 delivers power to the common node 120 being the boosted voltage and/or boost current which is coupled through a resistor R4 to the force line 122 of the circuit 100. As thus configured, the circuit 100 receives the driving voltage $V_S$ and the driving current $I_S$ from the tester power supply and generates the boosted output voltage and/or boosted output current coupled to the DUT pin (node 70). The gain of the amplifier 104 sets the boost ratio of the circuit 100.

The voltage-current conversion circuit 100 includes a ratiometric voltage sense circuit implemented as a voltage divider formed by resistors R2 and R3. In particular, the sense line 124 of the circuit 100 is coupled to sense the output voltage $V_O$ at the DUT pin (node 70). The sensed voltage is divided down by the voltage divider of resistors R2 and R3 to generate the feedback voltage $V_{OFB}$ being a scaled down version of the output voltage $V_O$. The feedback voltage $V_{OFB}$ is coupled to the amplifier 104 to regulate the output signal of the amplifier so that the feedback voltage $V_{OFB}$ is equal to the driving voltage $V_S$.

The voltage-current conversion circuit 100 includes a ratiometric current sense and load circuit implemented by the second operational amplifier 130 and resistors R4 to R6. In particular, the resistor R4 is connected in series with the force line 122 as a current sense resistor. The amplifier 130, configured in a negative feedback configuration, measures the differential voltage across the resistor R4 and generates an output voltage $V_{CS}$ (node 128).

In particular, the positive input terminal of amplifier 130 is connected to resistor R4 (node 122) and the negative input terminal of amplifier 130 is connected through resistor R5 to the other terminal of resistor R4 (node 120). The output voltage $V_{CS}$ is connected back to the negative input terminal of amplifier 130 through a resistor R6. The output voltage $V_{CS}$ (node 128) is coupled to drive a resistor R7 and a current load signal $I_{OL}$ flows in resistor R7 which is a scaled current of the load current being supplied to the DUT pin.

In operation, the amplifier 130 is connected in a negative feedback configuration and the voltage at the negative input terminal (node 132) is adjusted by the output voltage $V_{CS}$ (node 128) until the voltage at the negative input terminal (node 132) equals the voltage at the positive input terminal (node 122). When this equilibrium state is reached, the voltage difference across resistor R6 is the same voltage difference across the current sense resistor R4. Resistor R7 is selected to be a given ratio of resistor R4 so that the voltage difference is scaled down proportionally and is presented as a proportional load current to the tester power supply. In other words, the current $I_{OL}$ flowing in resistor R7 provides a simulated load to the tester output node 103 to enable the tester power supply to continue to regulate the driving voltage and driving current.

More specifically, the voltage difference across resistor R6 is given as $\Delta V$. The tester power supply sets the driving voltage Vs which is connected through resistor R7 to the output node of amplifier 130. Since the voltage $V_{CS}$ from amplifier 130 is $\Delta V$ lower than the output voltage $V_O$, the driving current $I_S$ from the tester power supply is: $V_O-(V_O-\Delta V)/R7$ which is $\Delta V/R7$. The driving current $I_S$ is thus proportional to the output current $I_O$ with a scale factor of R7/R4. Thus, the driving current $I_S$ is equal to the output current $I_O$ divided by the scale factor. In this manner, the tester power supply is able to regulate the load current supplied to the circuit 100 as if it is supplying the DUT pin.

In the present embodiment, the Darlington pair transistors Q1 and Q2 are implemented as bipolar transistors. In other embodiments, other transistor types, such as MOSFET devices, can be used. Furthermore, in other embodiments, linear regulators or operational amplifiers can be used in place of the Darlington pair transistors.

In embodiments of the present invention, the supply power $V_{Rail+}$ and $V_{Rail-}$ can be a high voltage and high current power supply. In that case, the supply power is generally provided by a power source external to the tester. In other embodiments, the supply power $V_{Rail+}$ and $V_{Rail-}$ can be a high voltage only power supply. In that case, the high voltage power supply can be generated from a power source of the tester using a DC-DC boost converter. In yet other embodiments, the supply power $V_{Rail+}$ and $V_{Rail-}$ can be a high current only power supply. In that case, the high current power supply can be generated from a power source of the tester using a DC-DC buck converter to down-convert the voltage so as to obtain high current drive.

In alternate embodiments of the present invention, the voltage-current conversion circuit is configured as a current only conversion circuit when high voltage is not required at the DUT or in the case where the tester power supply can deliver the required voltage but not the required current to the DUT. In that case, the tester power supply can sense the DUT pin directly which ensures the same voltage accuracy at the DUT as at the tester, with no additional error introduced by any intervening circuits.

Figure 6:
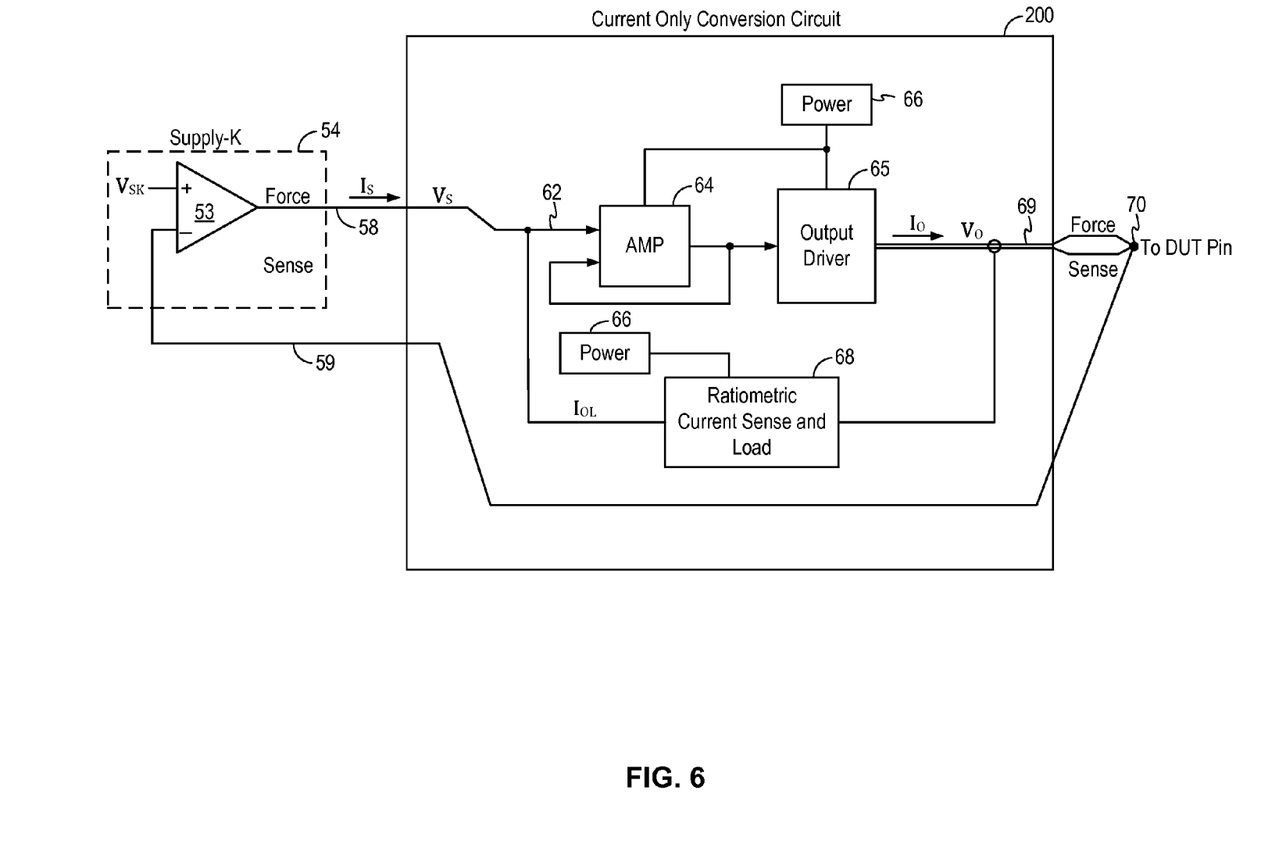
FIG. 6 is a schematic diagram of a current only conversion circuit according to one embodiment of the present invention.

FIG. 6 is a schematic diagram of a current only conversion circuit according to one embodiment of the present invention. The current only conversion circuit 200 of FIG. 6 is configured in a similar manner as the conversion circuit 60 of FIG. 4 with the ratiometric voltage sense circuit omitted. Like elements in FIG. 4 and FIG. 6 are given like reference numerals and will not be further described. Referring to FIG. 6, the current only conversion circuit 200 includes an amplifier 64 and an output driver 65 configured to receive the driving voltage and driving current from the tester power supply 54 and to drive the DUT pin (node 70) with a boosted current stimuli signal. When the conversion circuit 200 boosts only the current signal, the feedback circuit of the current only conversion circuit 200 includes only the ratiometric current sense and load circuit 68. Voltage regulation is performed directly by the tester power supply 54 and the amplifier 64 is configured as a unity gain voltage follower with the output of the amplifier connected back to its inverting input. In particular, the tester sense line 59 is connected to the DUT pin (node 70) directly to maintain tester voltage accuracy at the DUT. The output voltage $V_O$ at the DUT pin is sensed directly by the sense line 59 of the tester power supply 54 to regulate the driving voltage $V_S$ using the amplifier 53 of the tester power supply. The amplifier 64 regulates the driving voltage $V_S$ with a unity gain while the output driver provides a boosted current signal. The power source 66 is implemented as a high current only power source.

With the ratiometric current sense and load circuit 68 presenting a simulated load to the force line 58, the current only conversion circuit 200 boosts the current level of the drive current $I_S$ so that a high current signal is provided to the DUT pin (node 70).

Figure 7:
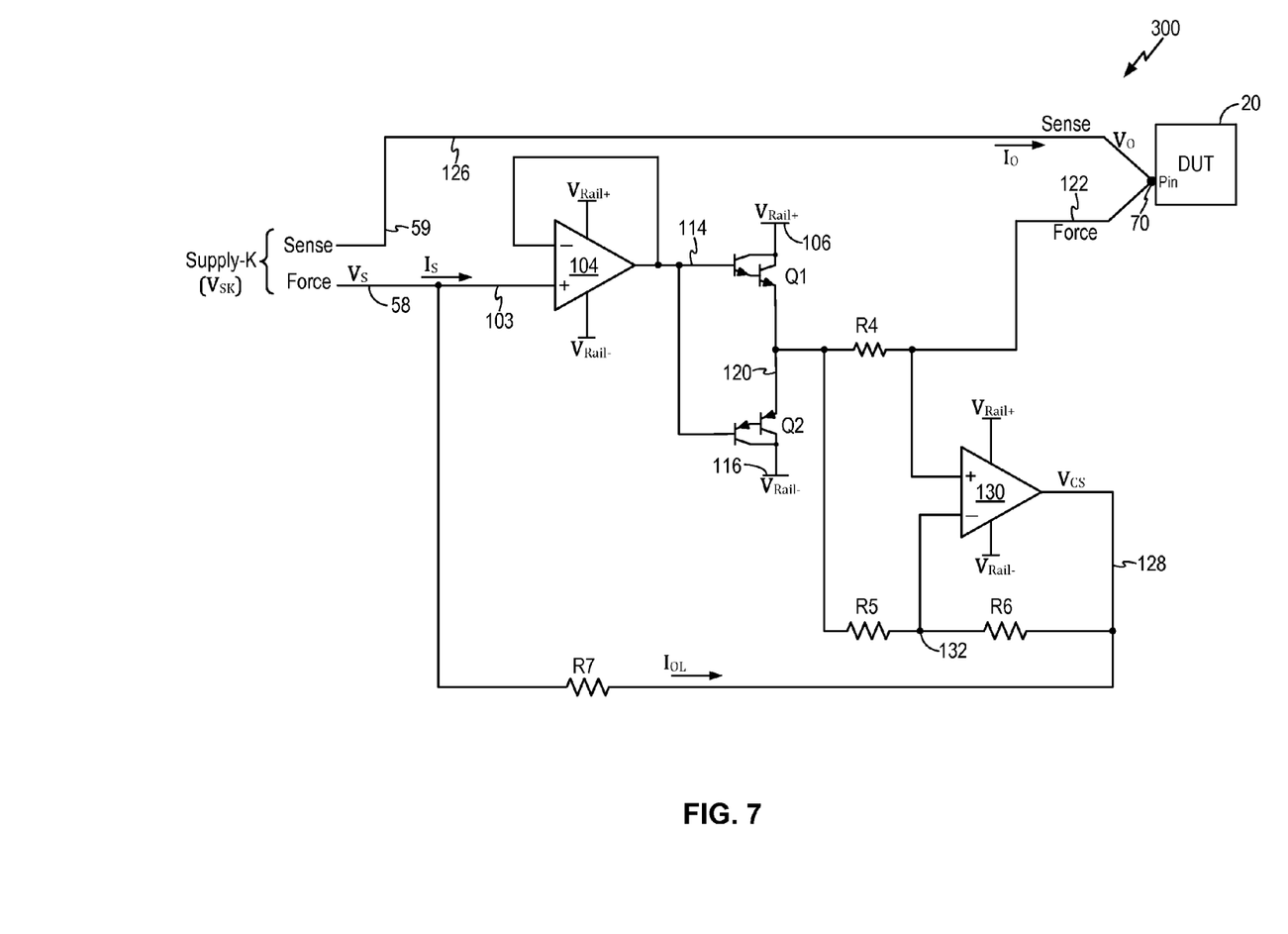
FIG. 7 is a circuit diagram of a current only conversion circuit according to one embodiment of the present invention.

FIG. 7 is a circuit diagram of a current only conversion circuit according to one embodiment of the present invention. The current only conversion circuit 300 of FIG. 7 is configured in a similar manner as the conversion circuit 100 of FIG. 5 with the ratiometric voltage sense circuit omitted. Like elements in FIG. 5 and FIG. 7 are given like reference numerals and will not be further described. Referring to FIG. 7, the current only conversion circuit 300 senses the output voltage $V_O$ at the DUT pin (node 70) directly using the sense line 59 of the tester power supply. The operational amplifier 104 is configured as a unity gain voltage follower with the output terminal (node 114) connected to the inverting input terminal. In this manner, the output voltage $V_O$ is directly regulated by the tester power supply.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A circuit for an automatic test equipment (ATE), the ATE including a tester power supply configured to provide a drive voltage and a drive current on a force line and to receive a feedback voltage on a sense line, the circuit comprising:
   an amplifier having a first input terminal coupled to the force line of the tester power supply and a second input terminal coupled to an output terminal, the output terminal providing an amplifier output signal;
   an output driver having an input terminal configured to receive the amplifier output signal and an output terminal providing an output voltage indicative of the drive voltage and an output current having a current value greater than and related to the drive current, the output voltage and the output current being coupled to a pin of a semiconductor device under test (DUT); and
   a feedback circuit comprising a ratiometric current sense circuit being configured to sense a current at the pin of the DUT, to scale down the sensed current and to couple the scaled current to the force line of the tester power supply as a simulated load to the tester power supply,
   wherein the amplifier, the output driver and the ratiometric current sense circuit are supplied by a high current power source; and the sense line of the tester power supply is coupled to the pin of the DUT to sense the voltage at the pin of the DUT as the feedback voltage.

2. The circuit of claim 1, wherein the output terminal of the output driver comprises a Kelvin connected force line and a sense line to be coupled to the pin of the DUT.

3. The circuit of claim 1, wherein the output voltage generated by the output driver is regulated by the tester power supply.

4. The circuit of claim 1, wherein the high current power source is generated from a power supply of the tester.

5. The circuit of claim 1, wherein the amplifier comprises an operational amplifier having a non-inverting input terminal coupled to the force line of the tester power supply and an inverting input terminal coupled to an output terminal of the operational amplifier, the output terminal providing the amplifier output signal.

6. The circuit of claim 1, wherein the output driver comprises a pair of serially connected Darlington transistors.

7. The circuit of claim 1, wherein ratiometric current sense circuit comprises:
   a current sense resistor coupled between the output terminal of the output driver and the pin of the DUT;
   a second operational amplifier having a non-inverting input terminal coupled to a first terminal of the current sense resistor at the pin of the DUT, an inverting input terminal coupled to an output terminal of the second operational amplifier through a first resistor, the inverting input terminal also coupled to a second terminal of the current sense resistor at the output terminal of the output driver through a second resistor; and
   a third resistor coupled between the output terminal of the second operational amplifier and the force line of the tester power supply.

8. A circuit for an automatic test equipment (ATE), the ATE including a tester power supply configured to provide a drive voltage and a drive current on a force line and to receive a first feedback voltage on a sense line, the force line and the sense line being Kelvin connected to a first node, the first feedback voltage being a voltage at the first node, the circuit comprising:
   an amplifier having a first input terminal coupled to the first node of the tester power supply and a second input terminal configured to receive a second feedback voltage, the amplifier having an output terminal providing an amplifier output signal;
   an output driver having an input terminal configured to receive the amplifier output signal and an output terminal providing an output voltage related to the drive voltage and an output current related to the drive current, the output voltage and the output current being coupled to a pin of a semiconductor device under test (DUT);
   a feedback circuit comprising a ratiometric current sense circuit being configured to sense a current at the pin of the DUT, to scale down the sensed current and to couple the scaled current to the first node of the tester power supply as a simulated load to the tester power supply; and
   the feedback circuit further comprising a ratiometric voltage sense circuit being configured to sense a voltage at the pin of the DUT, to scale down the sensed voltage and to couple the scaled voltage to the second input terminal of the amplifier as the second feedback voltage,
   wherein the amplifier, the output driver and the ratiometric current sense circuit are supplied by a high voltage and/or high current power source.

9. The circuit of claim 8, wherein the output terminal of the output driver comprises a Kelvin connected force line and a sense line to be coupled to the pin of the DUT.

10. The circuit of claim 8, wherein the output driver provides the output voltage being related to the drive voltage and having a voltage value greater than the drive voltage, the power source being a high voltage power source.

11. The circuit of claim 8, wherein the output driver provides the output current being related to the drive current and having a current value greater than the drive current, the power source being a high current power source.

12. The circuit of claim 8, wherein the output driver provides the output voltage being related to the drive voltage and having a voltage value greater than the drive voltage and provides the output current being related to the drive current and having a current value greater than the drive current, the power source being a high voltage and high current power source.

13. The circuit of claim 8, wherein the high voltage and/or high current power source is generated from a power supply of the tester.

14. The circuit of claim 8, wherein the amplifier comprises an operational amplifier having a non-inverting input terminal coupled to the first node of the tester power supply and an inverting input terminal configured to receive the second feedback voltage, and an output terminal of the operational amplifier providing the amplifier output signal.

15. The circuit of claim 8, wherein the output driver comprises a pair of serially connected Darlington transistors.

16. The circuit of claim 8, wherein ratiometric current sense circuit comprises:
    a current sense resistor coupled between the output terminal of the output driver and the pin of the DUT;
    a second operational amplifier having a non-inverting input terminal coupled to a first terminal of the current sense resistor at the pin of the DUT, an inverting input terminal coupled to an output terminal of the second operational amplifier through a first resistor, the inverting input terminal also coupled to a second terminal of the current sense resistor at the output terminal of the output driver through a second resistor; and
    a third resistor coupled between the output terminal of the second operational amplifier and the force line of the tester power supply.

17. The circuit of claim 8, wherein ratiometric voltage sense circuit comprises a voltage divider circuit configured to receive the voltage at the pin of the DUT and to generate a divided-down voltage as the second feedback voltage.

18. A method in an automatic test equipment for providing a signal stimulus to a pin of a semiconductor device under test, the method comprising:
    generating a drive voltage and a drive current at an output terminal of a tester power supply of the ATE;
    boosting the drive current to generate a boosted output current;
    providing the boosted output current and an output voltage indicative of the drive voltage to the pin of the semiconductor device under test;
    sensing a current at the pin of the semiconductor device under test;
    scaling down the sensed current to generate a scaled current;
    coupling the scaled current to the output terminal of the tester power supply as a simulated load to the tester power supply;
    sensing a voltage at the pin of the semiconductor device under test; and
    providing the sensed voltage to the tester power supply to regulate the output voltage provided to the pin of the semiconductor device under test.

19. A method in an automatic test equipment for providing a signal stimulus to a pin of a semiconductor device under test, the method comprising:
    generating a drive voltage and a drive current at an output terminal of a tester power supply of the ATE;
    boosting the drive current and the drive voltage to generate a boosted output current and a boosted output voltage;
    providing the boosted output current and the boosted output voltage to the pin of the semiconductor device under test;
    sensing a current at the pin of the semiconductor device under test;
    scaling down the sensed current to generate a scaled current;
    coupling the scaled current to the output terminal of the tester power supply as a simulated load to the tester power supply;
    sensing a voltage at the pin of the semiconductor device under test;
    scaling down the sensed voltage to generate a scaled sense voltage; and
    using the scaled sensed voltage to regulate the boosted output voltage provided to the pin of the semiconductor device under test.

* * * * *